United States Patent [19]

Keizer et al.

[11] 4,010,885
[45] Mar. 8, 1977

[54] APPARATUS FOR ACCURATELY BONDING LEADS TO A SEMI-CONDUCTOR DIE OR THE LIKE

[75] Inventors: Alan S. Keizer, Huntingdon Valley; Hugh R. Harris, Levittown, both of Pa.

[73] Assignee: The Jade Corporation, Huntingdon Valley, Pa.

[22] Filed: Sept. 30, 1974

[21] Appl. No.: 510,207

[52] U.S. Cl. .................... 228/6 A; 228/5.5; 226/58; 228/105
[51] Int. Cl.[2] ............................. H01L 21/601
[58] Field of Search ............ 228/4, 5, 6, 105, 106, 228/179, 180; 29/589, 590, 591, 626, 471.1, 471.3, 203 B; 219/85 F; 226/58, 143

[56] References Cited

UNITED STATES PATENTS

| | | | |
|---|---|---|---|
| 1,984,143 | 12/1934 | Kraft | 226/58 |
| 3,611,561 | 10/1971 | Dosier | 29/626 |
| 3,628,717 | 12/1971 | Lynch et al. | 228/6 |
| 3,689,991 | 9/1972 | Aird | 29/589 X |
| 3,696,985 | 10/1972 | Herring et al. | 228/4 |
| 3,698,618 | 10/1972 | Helda | 29/471.1 X |
| 3,709,424 | 1/1973 | Drees | 228/4 X |
| 3,722,072 | 3/1973 | Beyerlein | 29/471.3 |
| 3,724,068 | 4/1973 | Galli | 228/6 X |
| 3,739,463 | 6/1973 | Aird et al. | 29/591 X |
| 3,831,252 | 8/1974 | Miller | 29/203 B |

*Primary Examiner*—Al Lawrence Smith
*Assistant Examiner*—K. J. Ramsey
*Attorney, Agent, or Firm*—Seidel, Gonda & Goldhammer

[57] ABSTRACT

Apparatus for accurately bonding leads to a semi-conductor die or the like includes a hitch feed and guide assembly for sequentially positioning each set of leads on a film carrier format over the die to be bonded to the leads. A micromanipulator adjusts the leads relative to the die prior to bonding. Displacement means provide unambiguous rectilinear separate movement of the bonding tool laterally into alignment with the lead and semi-conductor and then into contact with the leads to apply bonding heat and pressure.

7 Claims, 15 Drawing Figures

APPARATUS FOR ACCURATELY BONDING LEADS TO A SEMI-CONDUCTOR DIE OR THE LIKE

This invention relates to apparatus for accurately bonding leads to a semi-conductor die. More particularly, this invention relates to a semi-automatic apparatus for sequentially advancing sets of leads on a film carrier format, aligning the leads with the particular die to which they are to be bonded while accurately retaining it in position, and then moving the bonding tool against the leads and die to effect a bond, said tool moving in two directions with unambiguous rectilinear motion.

BACKGROUND OF THE INVENTION

Semi-conductor dies are manufactured with a plurality of bonding pads spaced about their periphery in a more or less uniform configuration. To complete the semi-conductor die, a lead (sometimes called an inner lead) is bonded to each of the pads. These leads may then be bonded to yet another set of more rigid leads (outer leads). Thereafter, the die and leads are encapsulated. The reason for using both inner and outer leads is that the typical semi-conductor die cannot withstand the heat and pressure necessary to directly bond the structurally larger outer leads to the pads.

To increase production and yield, the semi-conductor industry has commenced using film-carrier techniques in place of the more widely used wire-bonding technique. A film carrier consists of a strip of film or foil having sprocket holes at its edge which incorporates lead frame. The leads are simultaneously bonded to the bonding pads on the die by a bonder. Sprocket holes along the sides of the film carrier function to provide a means to advance the film carrier after a die has been bonded and they also serve to register the lead frame precisely over the die, ensuring that each lead is centrally located over its own pad on the die.

The major advantage of the film-carrier technique over other techniques, such as wire-bonding, is that it lends itself to full automation.

Obviously, any such bonding apparatus must be extremely precise. Bonding pads and bonding lead widths usually fall within the range of 2 to 8 mils with 4 mil widths for the leads being typical. Failure to register the leads accurately over the pads of the die can defeat the advantages of film-carrier bonding. For example, a 2 mil shift from true position can readily produce an inadequate bond area leading to field failures or even short circuits.

Unfortunately, present-day techniques for manufacturing the film carrier are not sufficient to allow full automation. Thus, variations in the film carrier and the leads thereon result in the necessity for providing operator controlled final alignment. However, the film carrier technique remains advantageous over other bonding techniques because it can be made semi-automatic and produces greater yield.

The present invention provides an apparatus for bonding leads, particularly inner leads to semi-conductor pads using film carrier techniques. More particularly, the present invention provides a semi-automatic method for accurately performing such bonding processes. Still further, the present invention provides an apparatus which can be readily made fully automatic when this becomes an economic requirement.

In particular, the present invention provides apparatus for positioning the film carrier relative to the die while viewing the same through a properly aligned optical system. Bonding is effected by a thermocompression bonding tool which is constructed to apply a bonding force to the carrier and die in a direction normal to the surface of the die. Still further, the bonding tool support mechanism is constructed so that the tool does not obstruct the correct line of view (also normal to the die) of the optical system; to accomplish this, the mechanism for moving the bonding tool does so by separate, unambiguous rectilinear motion; e.g., laterally and then downwardly.

Still further, the bonding apparatus of the present invention provides a hitch feed and guide assembly for displacing the film carrier to sequentially position each set of leads over the die and retain the same in position for alignment and bonding.

For the purpose of illustrating the invention, there is shown in the drawings a form which is presently preferred; it being understood, however, that this invention is not limited to the precise arrangements and instrumentalities shown.

Figures 6, 7, 8:
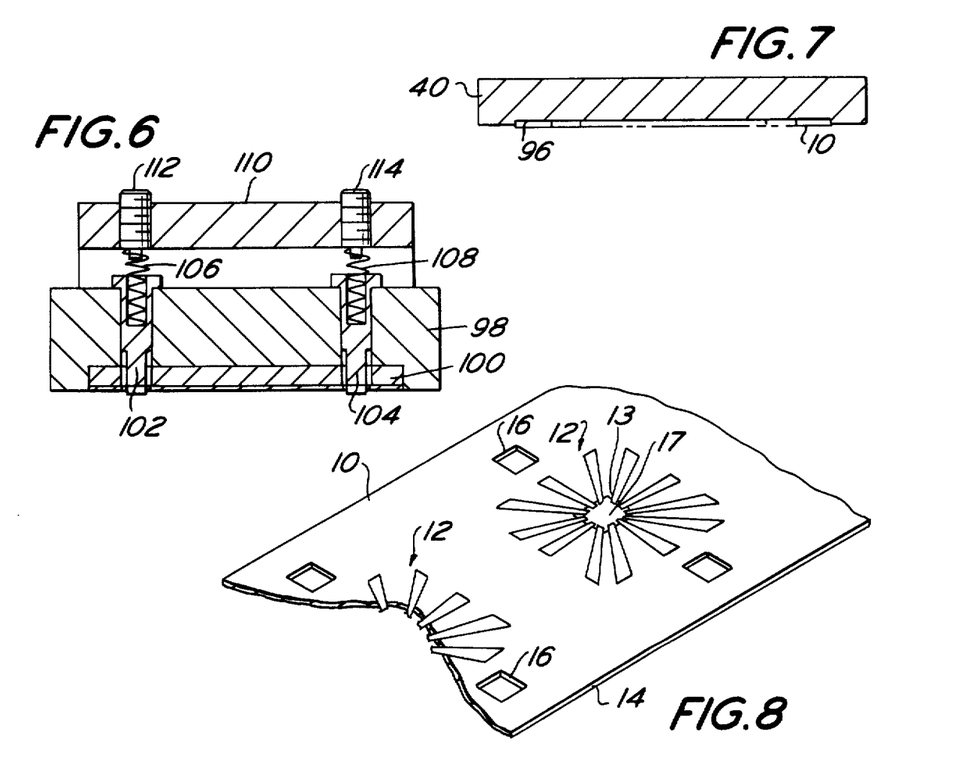
FIG. 6 is a transverse sectional view of the guide assembly shown in FIG. 5 taken along the line 6—6.
FIG. 7 is a transverse sectional view of the film track shown in FIG. 5 taken along the line 7—7.
FIG. 8 is a perspective of a film carrier.

Referring now to the drawings in detail, wherein like numerals indicate like elements, there is shown in FIG. 8 a lead frame film-carrier 10 for preformed inner leads 12. The film-carrier 10 is per se known in the art and generally comprises a plastic (e.g., polyimide) carrier 14, resembling movie film, that has lead frames 12 mounted along its surface.

Heretofore, the film-carrier has been designed to a standard 16 mm format as defined by American National Standards Institute (ASNI). The 16 mm dimension refers to the width of the film. It should be understood, however, that the apparatus described herein is not limited by any means to use with a 16 mm format. An 8 mm format has also been used and there is no reason why any non-standard format could not be used merely by replacing parts of the bonding apparatus to conform with, for example, requisite widths and pitch of the sprocket holes 16.

The film 14 is presently made of polyimide which is a thermosetting-type plastic characterized by its ability to withstand high temperatures and by its dimensional stability. The lead frames 12 are made of a metal foil (e.g., copper, nickel, gold or a combination of them) which is bonded to the film 14 and etched to form the leads by a process not relevant to the description of the present invention. The inner end 13 of each of the leads projects over a window 17 in the film 14 and by means of the bonding apparatus herein described they are aligned with the bonding pads on each die and thereafter gang-bonded, (as by thermocompression bonding), to the bonding pads. (As used throughout this disclosure and the claims, the term "die" refers to a semiconductor device such as, by way of example, an integrated circuit. The term "chip" and "die" are often used interchangeably in the industry and are so used in this disclosure.) Film-carriers were developed to provide for gang-bonding as a faster and more reliable method of providing the conductive leads than the well-known wire-bonding technique. The gang-bonding process allows each lead frame on the film 14 to be attached to a die in a single stroke of the bonding tool. The operation releases the die from the matrix in which it is held and the bonded dies are reeled onto a take-up spool. Thereafter, they are attached to outer lead frames or encapsulated in integrated circuit packages.

While the dimensions given herein are exemplary and can be varied according to the requirements of the industry, each inner lead within the lead frame 12 is typically 2.5 to 3 mils in width. Its length is variable. A typical length may be 100 mils. The thickness of an inner lead is typically 1.4 mils and such leads are normally made of what is described as 1 ounce copper. The ends of the leads 13 which project into the window 17 are typically plated with an intermediate layer of nickel which is 0.05 mils thick and a top layer of gold which is approximately 0.05 mils thick. The gold layer is what makes contact with the bonding pads on each die. Each bonding pad supports a small bump also made of gold when thermocompression bonding is used. Of course, metals other than gold can be used. Thermo-compression bonds to titanium-silver, silver, indium, aluminum, copper, silicon and lead are also possible. In addition to thermocompression bonding, eutectic bonding and soldering techniques may also be used. Thermocompression bonding, as the name implies, employs heat and pressure to create adhesion between the mating parts. It is a solid state bond based upon the principles of cross diffusion of the molecules; that is, there is no melting of the mating parts.

The process by which a lead frame 12 is bonded to a die is best understood by reference to FIGS. 11, 12, 13, 14 and 15 wherein the process is schematically illustrated. The remaining drawings illustrate the apparatus for performing the process and are described in more detail below.

As shown, the lead frame film-carrier 10 carrying the inner leads 12 are fed from a supply spool (not shown) along a film track 18 which acts as a guide. A window or opening 20 in the film track 18 allows the bonding tool 22 to rescend and apply heat and pressure to the inner leads 12. The film track 18 and hence the film-carrier 10 is fully adjustable in an imaginary plane through the window 20. Such adjustment, by means of a micro-manipulator, provides final alignment of the film-carrier and hence the leads 12 over the bonding pads 30 on the dies 24.

Figure 11:
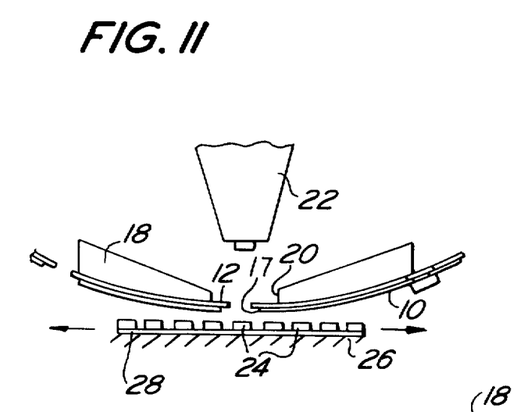
FIGS. 11, 12, 13, 14 and 15 are diagrammatic illustrations of the functional process performed by the bonding apparatus.

As shown, each die 24 is part of a matrix of such dies and is mounted on a carrier 26 by means of an adhesive 28. The adhesive 28 is a thermal release material such as bee's wax. The carrier 26 (sometimes referred to as a die dish) is held in position by means of a vacuum chuck on an X-Y-Z table. As indicated in FIG. 11, the X-Y-Z table is movable to index individual dies 24 into position beneath the window 20.

Figure 12:
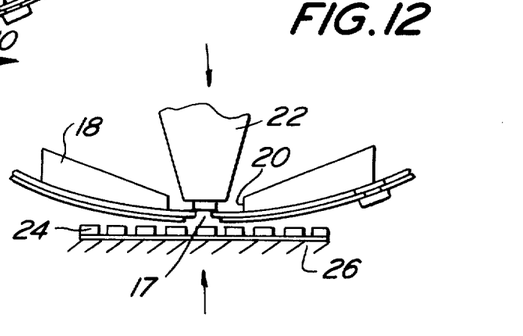
Figure 15:
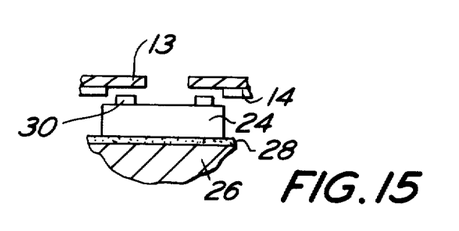

The film track 18 as well as the hitch feed 50 are mounted on a common supporting structure which is universally adjustable in the plane of the window 20 by means of a micromanipulator. The function of such adjustment is to align the ends 13 of the individual inner leads 12 over the bonding pads 30 as shown in FIG. 15. This function is accomplished by first raising the die carrier 26 and hence the dies 24 to a position just adjacent the window 20; i.e., the die is moved normal to the plane of the window which essentially defines the bonding site. This relationship, just prior to bonding, is shown in FIGS. 12 and 15. The adjustment is made by an operator viewing the inner leads 12 and die 24 through appropriate magnifying optics which, if desired, may be coupled to a television system for presentation on a television monitor.

Once the individual leads 12 have been aligned over the bonding pads 30, the bonding tool 22 is moved into contact with the lead frame film-carrier 20 and simultaneously applies both heat and pressure to all of the individual leads 13 within the lead frame 12 to bond them to the bonding pads 30 and die 24.

Figure 13:
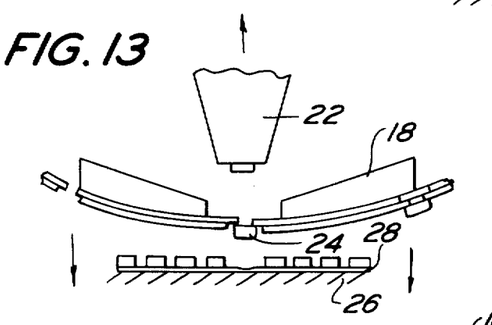

The bonding tool 22 and the die carrier 26 are moved away from the film-carrier 10 while the adhesive 28 is still in a molten or softened state thereby permitting the die 24 to remain attached to the inner leads 12 as indicated in FIG. 13.

Figure 14:
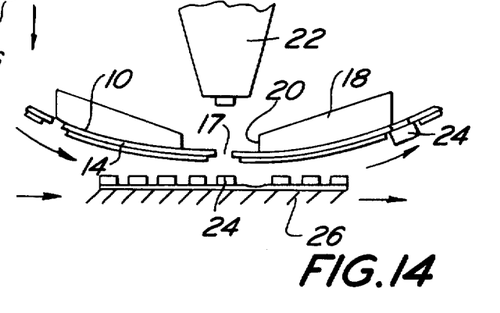

Thereafter, the lead frame film-carrier 10 is advanced to bring the next set of inner leads 12 into position beneath the window 20, and the carrier 26 is indexed to bring the next die 24 into position adjacent the window 17 in the film 14. Again, the film track 18 and hence the lead frame film-carrier 10 is positioned as described above. This process continues with respect to all usable dies 24 on the carrier 26.

In performing the process described above, it is necessary for the operator to view the inner leads 12 and die 24 along an axis that is normal to the plane of the window 20 because the individual inner leads 13 cannot be properly aligned with the bonding pads 30 if the line of view is at an angle. The small dimensions of the bonding pads 30 (typically 3 to 8 mils square) and the individual leads 13 make is necessary that the line of view be normal to the plane of the window 20 as well as to the plane of the opening 17 and the plane of the surface of the die 24 if proper alignment is to be achieved. It is also necessary that the bonding tool 22 be displaced along an axis that is coincident with the line of view. This being the case, it is obvious that the bonding tool cannot occupy the line of view while the leads 12 are being aligned with the bonding pads 30. Therefore, the bonding tool 22 must be removed from the line of view during the alignment step in the process. However, it is a design requirement that the bonding tool apply pressure to the leads 12 on the film 14 in a direction normal to the surface of the die 24. The application of force at any other angle would tend to smear the ductile material in the bonding pads 30 and would result in a poor bond.

The present invention overcomes this problem by providing apparatus for displacing the bonding tool into and out of the line of view of the optical apparatus along separate unambiguous, rectilinear paths. As illustrated in the embodiment described herein, such paths are laterally into the field of view and then downwardly against the inner leads 12.

One of the advantages of using the film-carrier 10 is that it permits each lead frame to be accurately and rapidly advanced into position adjacent the window 20. Assuming that the dimensions of the film-carrier remain uniform throughout its length, little or no adjustment of the film track 18 is required prior to the descent of the bonding tool 22.

Still another design requirement is that the film-carrier 10 be accurately held in position during the bonding step. In accordance with the present invention, there is provided apparatus for sequentially advancing the film-carrier 10 from lead frame to lead frame and accurately positioning it adjacent the window 20 so that the amount of adjustment of the film track 18 is minimized if not eliminated. In particular, it permits the degree of adjustment of the film track 18 to be reduced to the amount of variance of the film-carrier 10 within its tolerances.

The advantage of the foregoing is increased speed and reduced assembly costs.

Figure 1:
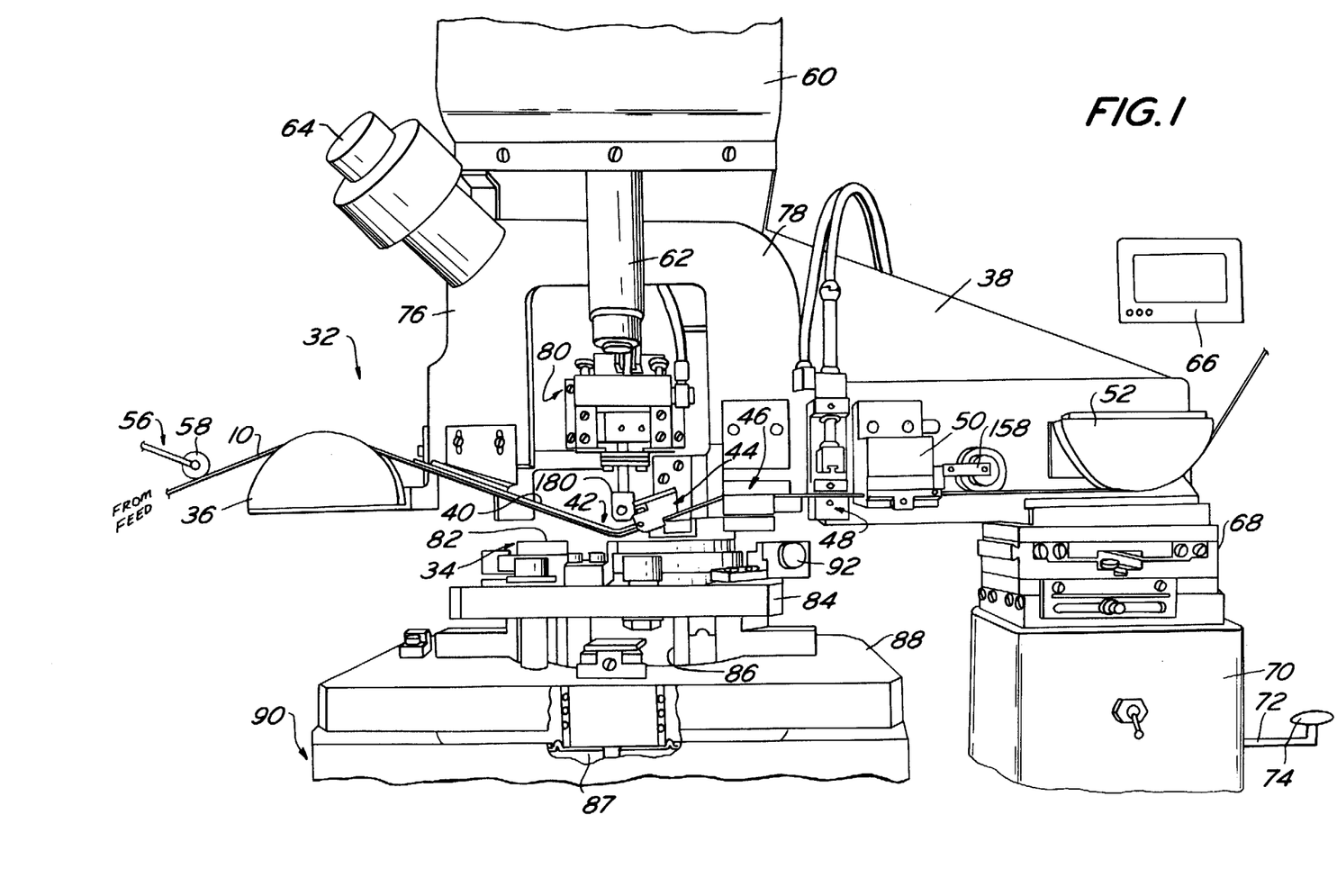
FIG. 1 is a perspective view of the bonding apparatus.

Referring now to FIG. 1 of the drawing, there is shown a bonding apparatus 32 for bonding inner leads mounted on the film-carrier 10 to dies (not shown) which may be fixed in position on the vacuum chuck 34.

The film-carrier 10 is fed from a reel (not shown) over the guide 36 mounted on the overarm support casting 38. The lead frame film-carrier 10 travels along the film track 40, past the bonding site 42, through the guide assembly 44, past the inspection assembly 46, through the punch assembly 48, through the hitch feed 50, and over the guide 52 to the take-up spool (not shown). The film track 40, guide assembly 44, inspection assembly 46, punch assembly 48, hitch feed 50 and guide 52 are all mounted on the overarm support casting 38. The feed and take-up mechanisms have not been shown since they are conventional and can be modified as desired to perform their respective functions. The feed and take-up mechanisms are preferably motor driven reels which operate independently of each other on a demand basis. More particularly, each is designed to feed or take up the film-carrier 10 whenever a predetermined amount of slack occurs in the film-carrier 10.

The idler arm 56 supports a weighted idler wheel 58 which constantly bears against the film-carrier 10 thus maintaining it under tension. This tension tends to draw the film-carrier 10 back toward the feed reel for the purpose explained in more detail below.

A housing 60 is supported on overarm support casting 38 and contains a television camera which is focused on the bonding site 42 through the magnifying optical system 62. The bonding site 42 is illuminated by a source of light 64.

The inspection assembly 46 probes the film-carrier 10 to determine whether die has in fact been bonded to the lead frame. If no bond has been made, as sometimes occurs, then the inspection assembly 46 signals the punch assembly 48 to punch a hole in the film-carrier at that particular lead frame so that automated apparatus used in further processing of the film-carrier (e.g., an outer lead bonder) will skip that particular lead frame position.

The output of the television camera within the housing 60 appears on the screen of the television monitor 66 for observation by the bonding apparatus operator.

The line of view of the optical system 62 is normal to the plane of the dies and the window 94 in the film track 40.

The entire overarm support casting is mounted in cantilever fashion on the X-Y table 68 which in turn is supported on the tower 70. A micromanipulator control arm 72 projects from the tower 70 and is provided with a control knob 74 at its distal end. The control arm 72 is connected to a pantograph whose secondary links are connected through concentric shafts to to the X-Y table 68. The function of the linkage is to convert motion of the micro-manipulator control arm 72 into rotational movement of the shafts and then orthonogal displacement of the elements of the X-Y table 68. This in turn shifts the position of the overarm support casting 38 and all of the apparatus affixed to it. In particular, it shifts the position of the film-carrier 10 as observed through the television system to align it with a die as described above. The micromanipulator per se is not described in detail since it is not a part of the present invention. Micromanipulators are known to those skilled in the art and for that further reason need not be described in detail. By way of example, the micromanipulator controlled by the arm 72 provides a 50 to 1 relationship between movement of the knob 74 and displacement of the film track 40 at the bonding site 42.

The overarm support casting 38 is bifurcated so that the entire bonding tool assembly 80 is supported by and between the arms 76 and 78.

The vacuum chuck 34 includes a vacuum plate 82 on which rests a die carrier. The vacuum plate 82 is fixed to a locating plate 84 which itself is mounted on a lift post 86. The lift post 86 rests on a lift plate 87 within a well in the base plate 88. The lift plate 87 is connected by bellows to an air diaphragm actuator which functions to lift the plate and hence the vacuum plate toward the film track 40. Appropriate bearings (not shown) guide the lift post 86.

The purpose for moving the vacuum plate and hence the dies fixed thereon toward the film-carrier 40 is, as explained previously, to bring a particular die into juxtaposition with the lead frame for alignment of its bonding pads with the inner leads and also to permit removal of the die from the die carrier after the bond has been effected. This is accomplished by lowering the vacuum plate thereby allowing the die to remain fixed to the film carrier 10. The die is released from the die carrier by the heat from the bonding tool which fuses the adhesive.

The base plate 88 is the top plate of an X-Y table 90. The X-Y table 90 is motor driven and electronically controlled for initially positioning individual dies at the bonding site 42.

If desired, the X-Y table 90 can be driven by stepping motors which, after prealignment, can be controlled by preprogrammed electronic circuitry designed to sequentially move individual dies into the bonding site 42 upon completion of a bonding cycle. By reason of the manner in which they are manufactured, dies are always set up in matrices which have a predetermined pitch between dies. Accordingly, programmed electronic controls can be used to automatically or semi-automatically set each individual die within a matrix into position at the bond site 42.

It should also be noted that the vacuum chuck 34 is provided with adjustment means 92 for rotating it relative to the locating table 84. This provides angular adjustment of the die carrier for proper alignment at the bonding site 42 with the film die 40.

Once the first die has been properly positioned at the bonding site by operation of an X-Y table 90 and angular adjustment mechanism 92, no further adjustment of that table should be necessary except to move the die carrier along X or Y orthogonal axes to position the next die to be bonded at the bonding site 42. All further alignment and final adjustment is accomplished by movement of the film track 40 through the micromanipulator arm 72.

Figure 5:
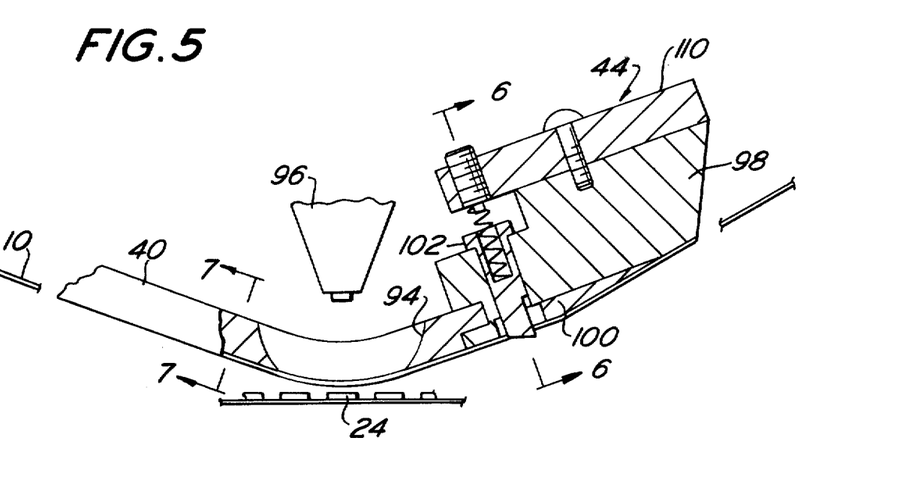
FIG. 5 is a longitudinal sectional view of the film carrier guide assembly.

FIG. 5 is an enlarged partial sectional view of the film track 40 and the guide assembly 44. FIGS. 6 and 7 are enlarged transverse sectional views which further illustrate details of these elements of bonding apparatus 32. The film guide 40 is provided with a window 94 through which the bonding tool 96 may pass to apply heat and pressure to individual dies 24. As shown in FIG. 7, the film track 40 is essentially a rigid structure in which has been machined a curvilinear channel 96 for guiding the film-carrier 10 past the window 94.

The function of the guide assembly 44 is to precisely fix the film-carrier 10 in position prior to and during the bonding operation. This permits the film-carrier to be accurately aligned by movement of the film track 40 as explained above and also it prevents movement as the bonding tool 96 drives the inner leads against the bonding pads on the die 24.

The guide assembly 44 includes a guide block 98 with a guide 100 defining a channel for the film-carrier 10 fixed to the bottom thereof. A pair of pawls 102 and 104 extend through aligned holes in the guide lock 98 and guide 100. The pawls 102 and 104 are normally biased to project slightly below the surface of guide 100 by the springs 106 and 108. Springs 106 and 108 are retained in position by means of the top plate 110 fixed to the guide block 98 and the set screws 112 and 114 which may be used to adjust the force applied to pawls 102 and 104. The downward extension of the pawls 102 and 104 is limited by flanges at their uppermost end.

As shown in FIG. 5, the surface of the pawls 102 and 104 which extends through the sprocket hole 16 in the film-carrier 10 is beveled so that the film-carrier 10 readily advances from the bonding site to the take-up reel. The pawls prevent it from retracting in the direction of the bonding site 42 once they have become engaged in the sprocket holes 16.

The function of the pawls 102 and 104 is to precisely fix the film carrier 10 along its longitudinal axis. For this purpose, the pawls function to merely engage the film-carrier 10 in its sprocket holes 16. Accordingly, the force applied to the pawls 102 and 104 by the springs 106 and 108 is just sufficient to overcome friction and cause them to firmly assume the position shown in FIG. 5.

It is desirable that the pawls 102 and 104 be located as close as possible to the bonding site 42. By way of example, the pawls 102 and 104 may be located approximately 600 mils from the center of the bond site which is a distance of two lead frames for 16 mm standard format film-carrier.

As previously explained, the idler arm 56 and weighted idler wheel 58 apply a constant tension on the film-carrier 10 tending to draw it back toward the feed or input side of the bond site. As described below, the hitch feed assembly 50 is constructed so that it advances the film-carrier 10 slightly more than one lead frame and then releases the film-carrier 10 thereby allowing it to retrace back toward the bond site by the amount of this over advancement. Retraction is stopped by engagement of the pawls 102 and 104 in sprocket holes 16. This retraction allows for a full and solid engagement by the pawls 102 and 104 and assures accurate positioning with respect to the window 94 at the bond site.

The tension of the film maintains it in engagement with the guide 100. This is emphasized by the cut-away shape of the bottom surface of the guide 100.

This means of fixing the film-carrier 10 is advantageous over known prior art devices which use shot or pilot pins to position the film-carrier. The shot pins are normally rounded at their distal end and force their way into a sprocket hole thereby causing film-carrier 10 to displace to accommodate them. The problem with using shot pins is that they wipe the edges of the sprocket holes thereby deforming them with a loss of accuracy in locating the film carrier for bonding and for future processing.

Figures 4, 9:
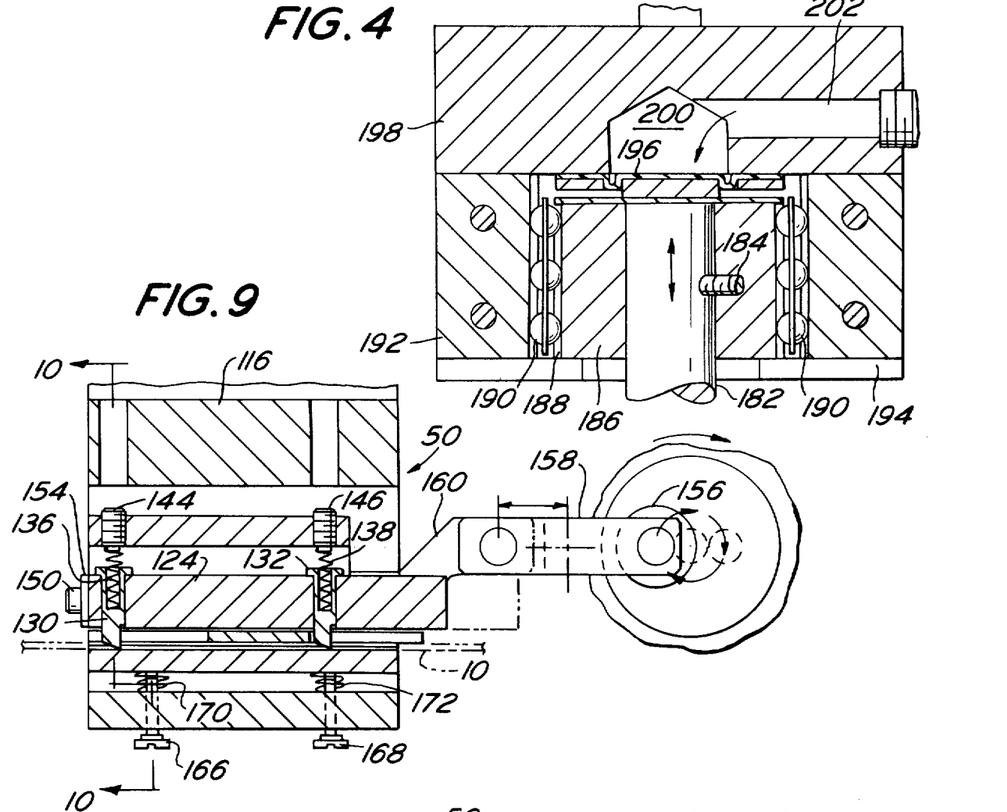
FIG. 4 is a transverse sectional view of an air spring mechanism for applying force to the bonding tool.
FIG. 9 is a longitudinal sectional view of the hitch feed assembly.
Figure 10:
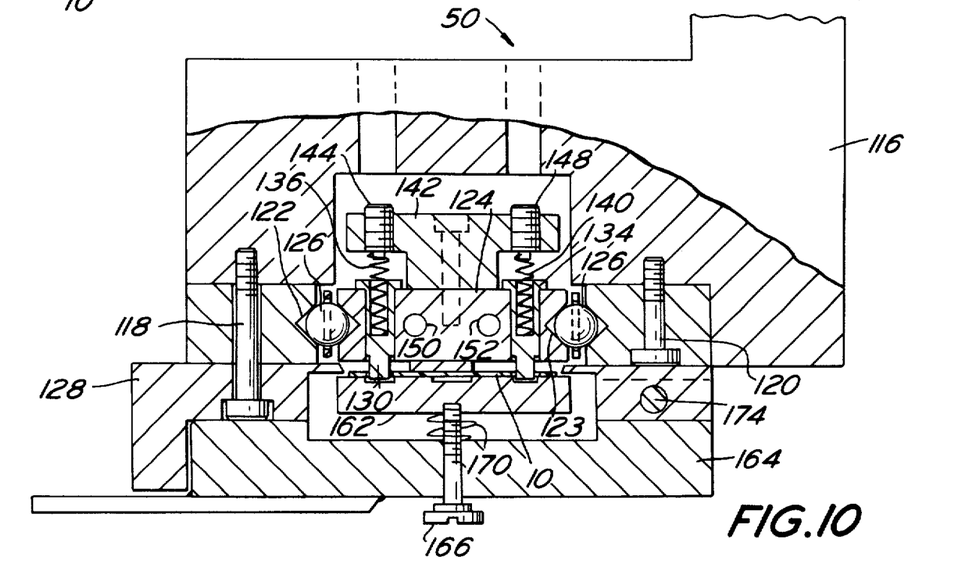
FIG. 10 is a transverse sectional view of the hitch feed assembly shown in FIG. 9 taken along the line 10—10.

The hitch feed assembly 50 is shown in detail in FIGS. 9 and 10. As previously indicated, its function is to sequentially advance the film-carrier 10 from lead frame to lead frame. This is accomplished accurately by means of a set of reciprocating pawls which sequentially engage the sprocket holes in the film-carrier 10 and advance it as required.

The hitch feed assembly 50 includes a mounting base 116 that is fixed to the overarm support casting 38. Cap screws 118 and 120 support an outer race 122 on the base 116. The shuttle 124 is retained for reciprocatory motion within the outer race 122 by the rails 150 and 152 which are held in position by the retainer cap 154. Bearings 126 are positioned between the outer race 122 and inner race 123.

Four pawls (three of which are shown) 130, 132 and 134 extend through bores in the shuttle 124. The pawls 130–134 are normally biased to the position shown in FIGS. 9 and 10 by the springs 136, 138 and 140 which are retained in position by means of the set screws 144, 146 and 148 on the retaining rail 142 which is fixed to the top surface of the shuttle 124. Set screws 144, 146 and 148 set the force on the pawls 130, 132 and 134 so that there is just sufficient force to overcome sliding friction and normally maintain them as shown in the drawings. The flanges on top of the pawls 130–134 limit their extension to just below the sprocket holes in the film-carrier 10.

The shuttle 124 is reciprocated by means of a crank mechanism including a motor driven connecting pin 156, a link 158 and connecting block 160 fixed to the shuttle 124. The link 158 converts rotary motion of the pin 156 to reciprocatory motion of the shuttle 124.

The film-carrier 10 is held in position within the hitch feed assembly 50 by means of a spring plate 162 mounted on a hinge plate 164 by means of the guide pins 166, 168 and springs 170 and 172. Hinge plate 164 is hinged to the support track 128 by a hinge pin 174 and may be swung open so that the film-carrier 10 can be loaded into the hitch feed assembly 50.

As shown in FIG. 9, the pawls 130, 132 and 134, as well as the pawl which is not shown, are beveled at their distal end so that they readily move out of the sprocket holes after advancing the film and returning to the home position. The shuttle 124 is shown in the home position in FIGS. 9 and 10. As such, it engages the film carrier 10 in the sprocket holes and advances it by a distance slightly greater than the distance between adjacent lead frames. As it returns to the home position, the pawls are out of the sprocket holes allowing the film-carrier 10 to retrace slightly to be engaged by the pawls 102 and 104 in the guide assembly 44.

The spring plate 162 exerts a constant small force on the bottom of the film-carrier 10 as it is advanced. This causes it to positively engage the bottom of the shuttle 124 and the pawls supported thereby. At the same time, the spring plate 162 accommodates any irregularity in the film-carrier such as, for example, increased thickness caused by splices.

The hitch feed mechanism is driven by a motor (not shown) and is controlled by a photoelectric detector that detects the home position by sensing appropriate markings on the shaft of the motor. It should be understood that the crank for driving the shuttle 124 is exemplary only. The drive mechanism could be other well known apparatus for reciprocating the shuttle. Some examples are an air cylinder or solenoid. The advantage of the crank mechanism described is that the acceleration and deceleration can be conveniently controlled thereby moving the film-carrier without damaging it.

The hitch feed assembly 50 is energized to advance the tape in accordance with a controlled sequence. The sequence is determined by electronic control circuitry which forms no part of the present invention and hence is not described herein. It is sufficient to state that such circuitry can be of any conventional design for directing the sequential operation of the bonding apparatus.

Figure 2:
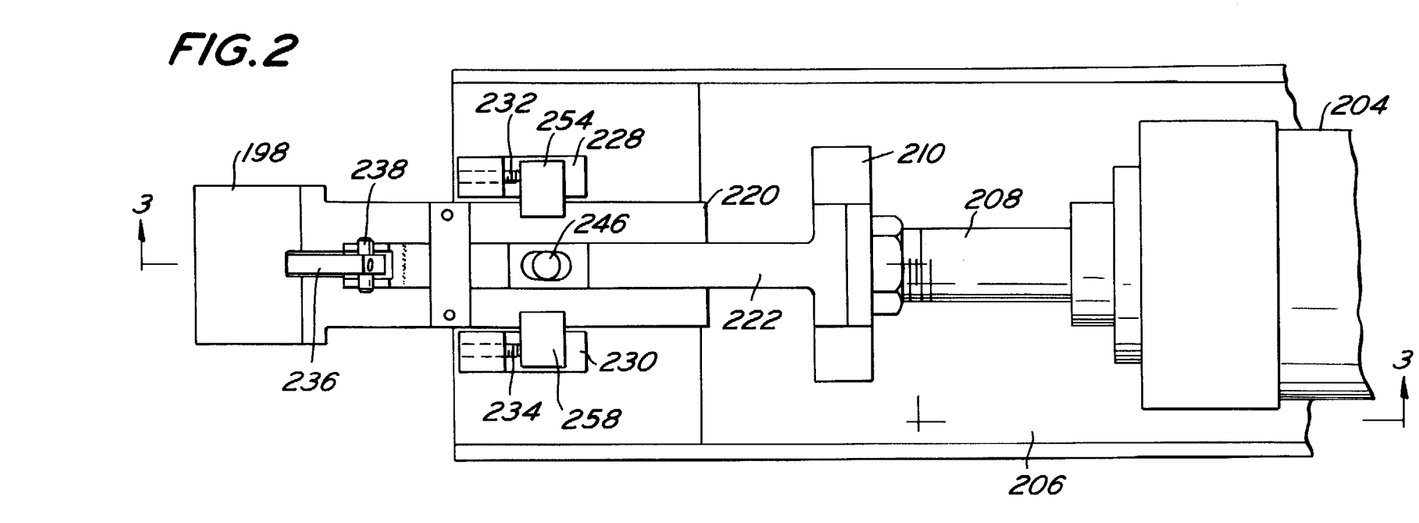
FIG. 2 is a top plan view of the bonding tool assembly.
Figure 3:
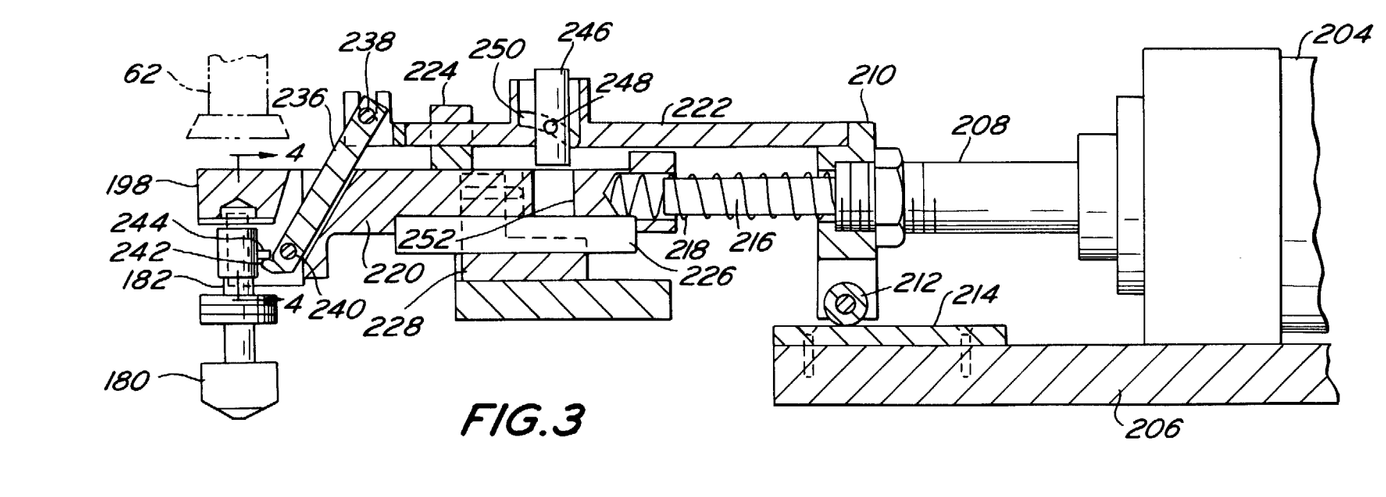
FIG. 3 is a longitudinal sectional view of the bonding tool assembly shown in FIG. 2 taken alone the line 3—3.

The bonding tool 180 is supported in a bonding tool assembly 80 that is constructed to provide unambiguous rectilinear separate motion for moving the bonding tool 180 into alignment with the window 94 and then into engagement with the film-carrier 10 and die 24. As shown in the drawings of the bonding apparatus 32, the unambiguous rectilinear separate motion of the bonding tool is laterally outward over the window 94 and then down. The apparatus for providing such separate motion is shown in FIGS. 2, 3 and 4. The bonding tool 180 is coupled to a shaft 182 that is held by means of a set screw 184 with a piston 186. An inner race 188 is formed on the outer surface of piston 186 and it rides on the bearings 190 which separates the piston 186 from the outer race 192. A cap plate 194 retains the bearings 190 within the races.

A flexible diaphragm 196 is attached to both the top of the piston 186 and the bottom of the clock 198 which has a chamber 200 and a conduit 202 adapted to be connected to a source of fluid pressure such as air.

Upon the application of pressure to the piston 186, the shaft 182 and hence the bonding tool are driven downwardly through the window 94 to apply force to the film-carrier and die which have previously been aligned. The bonding tool is lifted and retained in the up position by the catch mechanism lever 236 shown in FIGS. 3 ad 4 and described below. If desired, the bonding tool can be lifted by exhausting the chamber 200 so that atmospheric pressure on the piston 186 forces it up.

The apparatus for providing lateral displacement of the bonding tool 180 is shown in FIGS. 2 and 3. An air cylinder 204 is mounted on a cylinder mounting plate 206 which is appropriately fixed to the overarm support casting 38 by means not shown. The distal end of the cylinder ram 208 is connected to a yoke 210. A roller 212 is mounted on the bottom of yoke 210 and provides a support bearing in contact with the roller plate 214 fixed to the cylinder mount plate 206.

The yoke 210 also supports a guide rod 216 which in turn supports a compression spring 218. The compression spring 218 extends into a bore in the end of the slide 220.

Also mounted on the yoke 210 is a push rod 222 which is mounted for sliding movement relative to the slide 220 by means of the slide bearing 224, fixed to slide 220.

The slide 220 reciprocates on slide mounting plate 226 and it is constrained for unilinear motion by means of a key and way (not shown) or other appropriate guide mechanism. The slide mounting plate 226 also supports the slide stops 228 and 230 in which are threaded stop adjustment screws 232 and 234.

The push rod 222 is bifurcated at its distal end and rotatably supports a lever 236 on the pin 238. The other end of lever 236 is rotatably fixed to the mounting block 198 by the pin 240. Block 198 is fixed to the slide 220.

The finger 242 at the end of lever 236 engages a projection 244 fixed to the shaft 182 and functions to retain the shaft in its upper position until it is rotated out of contact therewith by the forward motion of the push rod 222. The slot in which the pin 238 allows for slight upward motion of the pin 238 as the lever 236 rotates the finger 242 out of contact with the projection 244. When the push rod 22 is reciprocated back to its initial position, finger 242 lifts the tool 180 out of contact with the film-carrier 10.

A locking pin 246 is slidingly retained within a bore through the push rod 22 by means of a pin 248 that slides within the slot 250. The slot 250 is shaped such that in the fully retracted position of the ram 208 the pin 246 engages the slide 220 in the bore 252.

The bonding tool assembly 80 operates in the following manner. For purposes of illustration, it is shown in mid stroke in FIG. 3. It is assumed that the application of fluid pressure by the air cylinder 204 has driven the ram 208 laterally to the position shown. This is accomplished by transmission of force through the compression spring 218 to the slide 220. The lateral motion of slide 220 continues until stop blocks 254 and 258 engage the stop adjustment screws 232 and 234. At this point, the ram 208 continues to extend from the air cylinder 204 compressing the spring 218. This motion drives the push rod 222 forward relative to the slide 220 thereby lifting the pin 246 out of the bore 252 and pivoting the finger 242 out of contact with the projection 244. The stop adjustment screws 232 and 234 provide a means for adjusting the position of the bonding tool 180 so that it will be precisely over the bonding site when the finger 242 is moved out of contact with the projection 244.

The function of the pin 246 is to lock the push rod 222 to the slide 220. Thus, the pin 246 and bore 252 are precisely machined to a clearance of 0.0002 inches. The pin 246 provides rigidity for the system and it also interlocks the elements so that there is no chance that the bonding tool will be released until the slide 220 has engaged the stop adjustment screws 232 and 234. The pin 246 both rigidifies and increases the point repeat accuracy of the system.

The bonding apparatus 32 is used in the following manner. A supply of film-carrier 10 is inserted in the apparatus and checked for accurate alignment within all of the parts. Thereafter, a die carrier 26 supporting a matrix of dies 24 is mounted on the vacuum plate 82. The television system is energized and the operator observes the dies 24 on the screen of the television set 66. The first die to be bonded is brought into alignment with a reticle in the optical system by movement of the X-Y table 90, and if necessary, angular adjustment mechanism 92.

The vacuum plate 82 and the die carrier is raised by applying fluid pressure to the lift post 86 as described above. This bring the die 24 into position as shown in FIG. 5.

The operator next aligns the inner leads with the bonding pads on the die 24 by means of micromanipulator operated through the arm 72. This adjusts the position of the overarm support casting 38 and hence the window 94. The guide assembly 44 retains a film-carrier in proper position over the window 94. Once the lead frame and bonding pads are aligned, the operator depresses a switch which operate the bonding tool assembly. The bonding tool 80 moves laterally out over the window and then downwardly into engagement with the leads on the film-carrier and the preselected die. The head of the bonding tool applies the correct amount of heat and pressure to the carrier and die thereby effecting a solid state bond. The time of contact is controlled accurately by a dwell timer and is, by way of example, 0.25 seconds for a 14 lead device. During this time, the bonding tool 180 may apply a force of 3 pounds and is heated to a temperature of 500° to 550° C. The temperature at the interface between the tool and the inner lead is 350° to 400° C. Of course, variations in the foregoing are determined in accordance with semiconductor device being processed.

After the bond has been made, the bonding tool is retracted upwardly and laterally. The vacuum plate 82 is moved downwardly away from the bond site thereby leaving the die fixed to the film-carrier.

The next step of the operation is to index the tape to thereby bring a new lead frame into position over the window 94. This is accomplished by operating the hitch feed assembly 50 whose pawls engage the sprocket holes of the film-carrier 10 and draw it in the take-up direction. As previously explained, the hitch feed slightly over advances the film-carrier 10. However, the tension toward the feed direction draws the film-carrier back toward the guide assembly 44 as the hitch feed returns to the home position shown in FIG. 9. The pawls in the guide assembly engage the sprocket holes in the film-carrier 10 and fix it in position. The X-Y table 90 is indexed to bring another die into position for alignment. The vacuum plate is again lifted to the up position and the cycle commences again.

The present invention may be embodied in other specific forms without departing from the spirit or essential attributes thereof and, accordingly, reference should be made to the appended claims, rather than to the foregoing specification as indicating the scope of the invention.

We claim:

1. Apparatus for bonding leads of a lead frame on a film carrier to a die of the type having a plurality of bonding pads, comprising:
   means for positioning a die having a plurality of bonding pads adjacent a planar bonding site;
   a film carrier track for guiding a film carrier having at least one lead frame thereon to a position adjacent the planar bonding sites;
   means for adjusting said film carrier track to align a lead frame on the film carrier with the die bonding pads adjacent the bonding site;
   a bonding tool disposed above the film carrier track;
   slide means for automatically moving said bonding tool rectilinearly in a plane substantially parallel to the bonding site from a first rest position at which said bonding tool is spaced apart from a line of view substantially perpendicular to the bonding site to a second position at which said bonding tool is coincident with the line of view, said line of view being unobstructed when said bonding tool is at said first rest position;
   means for moving said bonding tool rectilinearly along the line of view from the second position to a third position at which said bonding tool is in operative contact with the lead frame and die adjacent the bonding site; and
   means operatively associated with said slide means for inhibiting movement of said bonding tool towards the bonding site until the bonding tool is coincident with the line of view and for permitting uninhibited movement of said bonding tool when it is coincident with the line of view.

2. Apparatus for bonding leads of a lead frame on a film carrier to a die of the type having a plurality of bonding pads, comprising:
   a film carrier track for guiding a film carrier having at least one lead frame thereon to a position adjacent a planar bonding site;
   die carrier means disposed beneath said film carrier track for supporting a plurality of dies of the type having a plurality of bonding pads;
   means for adjusting said die carrier means such that a die supported thereby is aligned with the bonding site;
   means for adjusting said film carrier track to align a lead frame on the film carrier with the die bonding pads adjacent the bonding site;
   means for reciprocally moving said die carrier means along a path substantially perpendicular to the bonding site, from a first position at which the die is removed from the bonding site to a second position at which the die is adjacent the bonding site;
   a bonding tool disposed above the film carrier track; and
   means for moving said bonding tool rectilinearly from a first rest position displaced laterally from the bonding site to a second position in registry with the bonding site and for moving said bonding tool from said second position into operative contact with the lead frame and die adjacent the bonding site.

3. Apparatus in accordance with claim 1 wherein said inhibiting means includes:
   catch means for engaging said bonding tool in a manner which will prevent said bonding tool from being displaced into said third position;
   push rod means slidably mounted for displacement relative to said slide means, said push rod means being connected to said means for effecting displacement of said slide means and being engaged with said catch means to move said catch means out of engagement with said bonding tool in response to relative movement of said slide means and said push rod means; and
   means for preventing relative displacement of said push rod means and said slide means to effect disengagement of said catch means with said bonding tool until said slide means is displaced to a position whereby said bonding tool is in said second position.

4. Apparatus in accordance with claim 2, wherein said die carrier means comprises an XYZ table.

5. Apparatus in accordance with claim 1 wherein said film carrier track is adapted to guide a film-carrier having sprocket holes therein, said film-carrier track comprising:

feed means for advancing the film-carrier to sequentially bring individual lead frames to the bonding site;

means for accurately positioning the film-carrier at the bonding site including pawls for engaging the film-carrier in its sprocket holes;

means for biasing said film-carrier in the direction opposite to the direction of advance by the feed means; and     said feed means including means to over-advance the film-carrier and then release it so that the biasing means moves it back toward the bonding site until it is engaged by the pawls in the positioning means.

6. Apparatus in accordance with claim 5 wherein said feed means includes:

a reciprocable shuttle;

pawls depending from said shuttle for engaging the film-carrier in the sprocket holes.

7. Apparatus in accordance with claim 1 wherein said first and second paths are separate, rectilinear paths.

* * * * *